(12) United States Patent
Pascucci (10) Patent No.: US 6,438,040 B1
(45) Date of Patent: Aug. 20, 2002

(54) ENABLING CIRCUIT FOR OUTPUT DEVICES IN ELECTRONIC MEMORIES

(75) Inventor: Luigi Pascucci, Sesto San Giovanni (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/629,229

(22) Filed: Jul. 31, 2000

(51) Int. Cl.[7] .............................................. G11C 16/04
(52) U.S. Cl. .................... 365/189.05; 365/194
(58) Field of Search ................ 365/189.05, 189.01, 365/194, 189.11, 230.08, 189.04

(56) References Cited

U.S. PATENT DOCUMENTS

| | | | | |
|---|---|---|---|---|
| 5,384,735 A | * | 1/1995 | Park et al. ............. | 365/189.05 |
| 5,404,334 A | * | 4/1995 | Pascucci et al. ............. | 365/210 |
| 5,488,581 A | * | 1/1996 | Nagao et al. .......... | 365/189.05 |
| 5,532,961 A | * | 7/1996 | Mori et al. ............. | 365/189.05 |
| 5,798,969 A | * | 8/1998 | Yoo et al. ............... | 365/189.05 |
| 5,859,810 A | * | 1/1999 | Pascucci et al. ........ | 365/230.01 |
| 5,905,678 A | * | 5/1999 | Pascucci ................ | 365/189.05 |

\* cited by examiner

Primary Examiner—Richard Elms
Assistant Examiner—Anh Phung
(74) Attorney, Agent, or Firm—Lisa K. Jorgenson; Allen, Dyer, Doppelt, Milbrath & Gilchrist, P.A.

(57) ABSTRACT

An enabling circuit for an output buffer in a memory having separate reading paths includes an output buffer driver for driving loading of the output buffer, and an output enabling circuit for enabling the output buffer driver. A timing circuit controls the switching of the output enabling circuit. A switching circuit is responsive to a read mode signal for providing a stimulus signal for loading of the output buffer and for performing a switching between the separate reading paths of the memory.

55 Claims, 3 Drawing Sheets

ENABLING CIRCUIT FOR OUTPUT DEVICES IN ELECTRONIC MEMORIES

FIELD OF THE INVENTION

The present invention relates to an enabling circuit for output devices in electronic memories which allows updating of the data presented outside the memory in accordance with a memory architecture of the interleaved type.

BACKGROUND OF THE INVENTION

It is known that in conventional electronic memories the output circuits are normally managed by a timing which is meant to activate a direct connection between the sense amplifier and the corresponding output stage.

This connection is usually continuous and maintained over time, but it can be of the sampled type when using output stages which are internally provided with a latch structure.

However, at the end of a read cycle there is always an updating of the output stage, and such updating is always the image of the data item produced by the sense amplifier.

Moreover, the circuits that oversee the generation of the control signals of the output stage have the sole purpose of ensuring the correct updating of the memory output buffer.

The problem of the tristate configuration that the memory can assume is particularly simple, and since it is independent of the actual moment when the output stage is updated, it is managed autonomously and immediately by two control signals which are provided for this task, i.e., OEn (Output Enable) and CEn (Chip Enable).

In memories having an architecture of the interleaved type, which are the subject of copending patent applications in the name of this same Applicant as the present application, the control circuits can no longer be considered as such in the conventional sense, and the particularities of the architecture of the memory lead to the need to find different approaches.

SUMMARY OF THE INVENTION

The aim of the present invention is to provide an enabling circuit for output devices in electronic memories to ensure a connection between the sense amplifier and the corresponding output buffer in more than one of the operating modes that the memory can assume.

Within the scope of this aim, an object of the present invention is to provide an enabling circuit for output devices in electronic memories to generate synchronization signals which are useful for synchronization of the timing activities of the memory.

Another object of the present invention is to provide an enabling circuit for output devices to stimulate the timing activities of the memory in accordance with the configuration of the control signals that are characteristic of the current operating mode of the memory.

Another object of the present invention is to provide an enabling circuit for output devices in electronic memories to present the data in output synchronously, asynchronously or in a deferred mode.

Another object of the present invention is to provide an enabling circuit for output devices in electronic memories in which the conditions allowing updating of the output devices are compatible with the interleaved protocol used in the memory.

Another object of the present invention is to provide an enabling circuit for output devices in electronic memories to disable, when required, the external visibility of the data read by the sense amplifier.

Another object of the present invention is to provide an enabling circuit for output devices in electronic memories to generate pulses whose duration is closely correlated to the propagation characteristics of the controlled networks, such as address increment circuits and the like.

Another object of the present invention is to provide an enabling circuit for output devices in electronic memories which allows in general management in a flexible manner the reading operations in the volatile and non-volatile memory.

Another object of the present invention is to provide an enabling circuit for output devices in electronic memories which provides visibility of the data by pulsed signals when a synchronous mode is chosen (interleaved function) or by continuous signals which are closely linked to the external control signals when a synchronous or conventional mode is chosen.

Another object of the present invention is to provide an enabling circuit for output devices in electronic memories which can produce the updating pulse promptly at each transition prescribed by the interleaved protocol.

Another object of the present invention is to provide an enabling circuit for output devices in electronic memories to preset the conditions of suitability for a new pulse exclusively following a verified lo condition of low level of the RD signal.

Another object of the present invention is to provide an enabling circuit for output devices in electronic memories which is capable of producing control signals adapted to prevent the memory from being sensitive to noise.

Another object of the present invention is to provide an enabling circuit for output devices in electronic memories which is highly reliable, relatively simple to manufacture and at competitive costs.

This aim, these objects and others which will become better apparent hereinafter are achieved by an enabling circuit for output devices in electronic memories, comprising:

means for driving the loading of an output buffer of an electronic memory;

output enabling means which are adapted to drive said output buffer loading driver means;

timer means which are adapted to control the switching of said output enabling means;

a stimulus signal for the loading of said output buffer, produced by switching means, on the basis of a read mode signal, which performs a switching, inside said switching means, between separate reading paths of said electronic memory.

BRIEF DESCRIPTION OF THE DRAWINGS

Further characteristics and advantages of the invention will become better apparent from the following detailed description of a preferred but not exclusive embodiment of the circuit according to the invention, illustrated only by way of nonlimiting example in the accompanying drawings, wherein.

DESCRIPTION OF THE PREFERRED EMBODIMENTS

Figure 1:
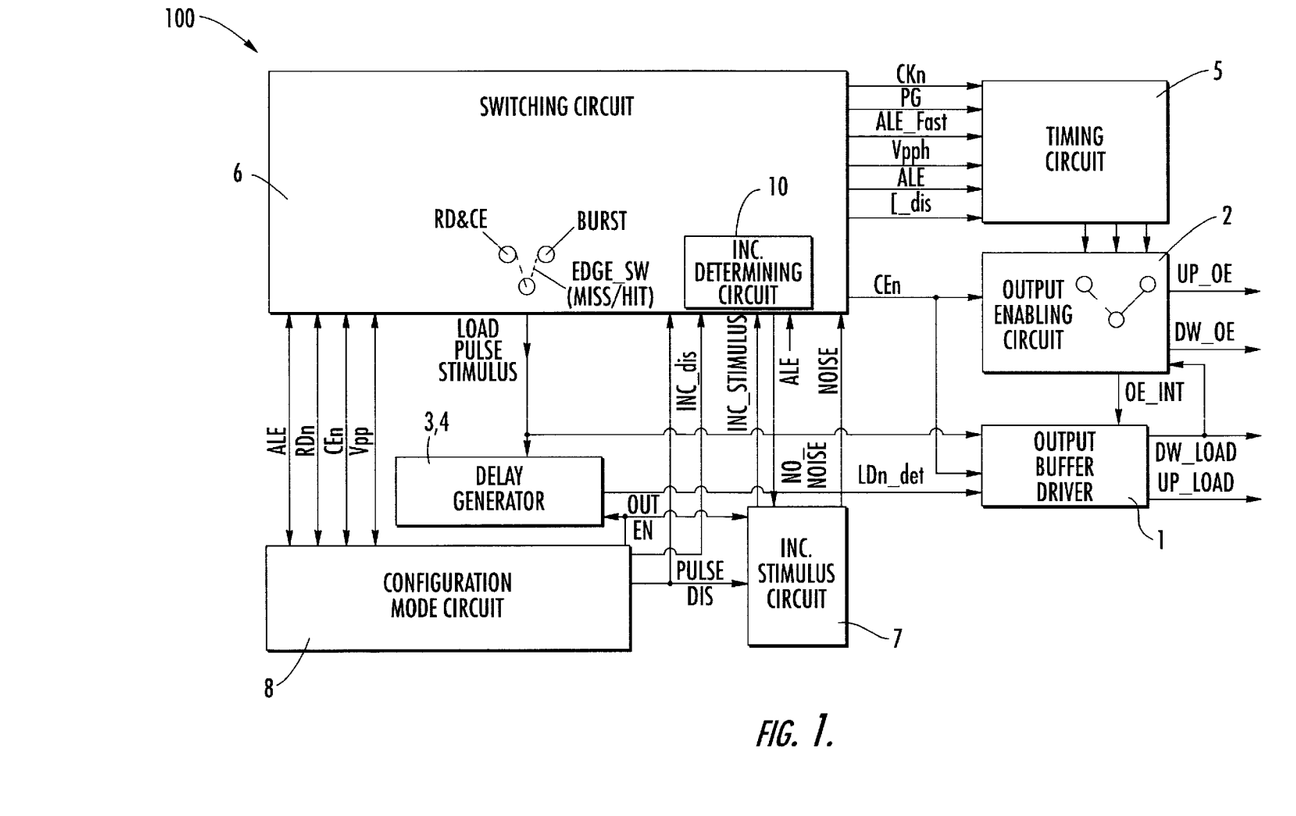
FIG. 1 is a block diagram of the circuit according to the present invention.

With reference to the above-cited figures and initially to FIG. 1, the circuit according to the invention, generally designated by the reference numeral 100, comprises means 1 for driving the loading of an output buffer of the memory which are driven by output enabling means 2 which are in turn controlled by timing means 5 for switching the output enabling means 2.

The means 5 for timing the switching of the means 2 are in turn controlled by switching means 6, which exchange with the timing means 5 a plurality of signals described in detail hereinafter.

The output buffer driving means 1 are driven by a signal for stimulating the loading of the output buffer, designated by the reference STIMULUS, which is produced by the switching means 6, on the basis of a read mode signal which is adapted to perform, inside the switching means 6, switching between different types of read paths.

The stimulus signal STIMULUS is sent not only to the means 1 for driving the output buffer of the memory but also to means for creating an increment and output delay, i.e., to means 3 and 4 which generate a delay which is adapted to delay the operation of the driver means 1 of the output buffer and the operation of increment stimulus means 7.

Conveniently, configuration mode means 8 exchange signals with the switching means 6 and with the increment stimulus means 7.

In detail, the switching means 6 exchange with the switching timing means 5 the following signals:

CKn: negated clock signal;
PG: signal indicating the programming of the memory:
ALE-fast: fast read address latch enable signal;
Vpph: power supply signal;
ALE: memory read address latch enable signal.

The switching means 6 further exchange with the configuration mode means 8 the following signals:

ALE;
RDn: negated memory read signal;
CEn: negated chip enable signal;
Vpp.

The delay generator means 3 and 4 send a signal LDn-det to the driver means 1, meant to detect the presence of a signal for loading the driver means 1. The switching means 6 sends to the driver means 1, as well as to the output enabling means 2, the signal CEn which, together with the signal LDn-det, stops the driver means 1.

The load stimulus signal STIMULUS is instead sent to the driver means 1 and to start the driver means, with consequent production of the loading signals DW-load and UP-load.

The output enabling means 2 instead emits output enabling signals UP-OE and DW-OE. The configuration mode means 8 sends to the delay means 3 and 4 and to the increment stimulus means an output enabling signal OUT-EN and sends to the switching means 6 an address increment disabling signal INC-dis, which is sent to the means for determining an increment INC of the address, designated by the reference numeral 10.

The increment determining means 10 further receives a loading stimulus increment signal INC-stimulus, which is sent by the increment stimulus means 7.

The increment signaling means 10 further receives the signal ALE and sends to the increment stimulus means 7 a signal NO-NOISE which indicates the absence of noise.

The circuit according to the invention is completed by means 12 for modulating the duration of the pulse STIMULUS, which are connected downstream of the switching means 6, and by means 13 for modulating the duration of the output signal of the means 3 and 4.

Figure 2:
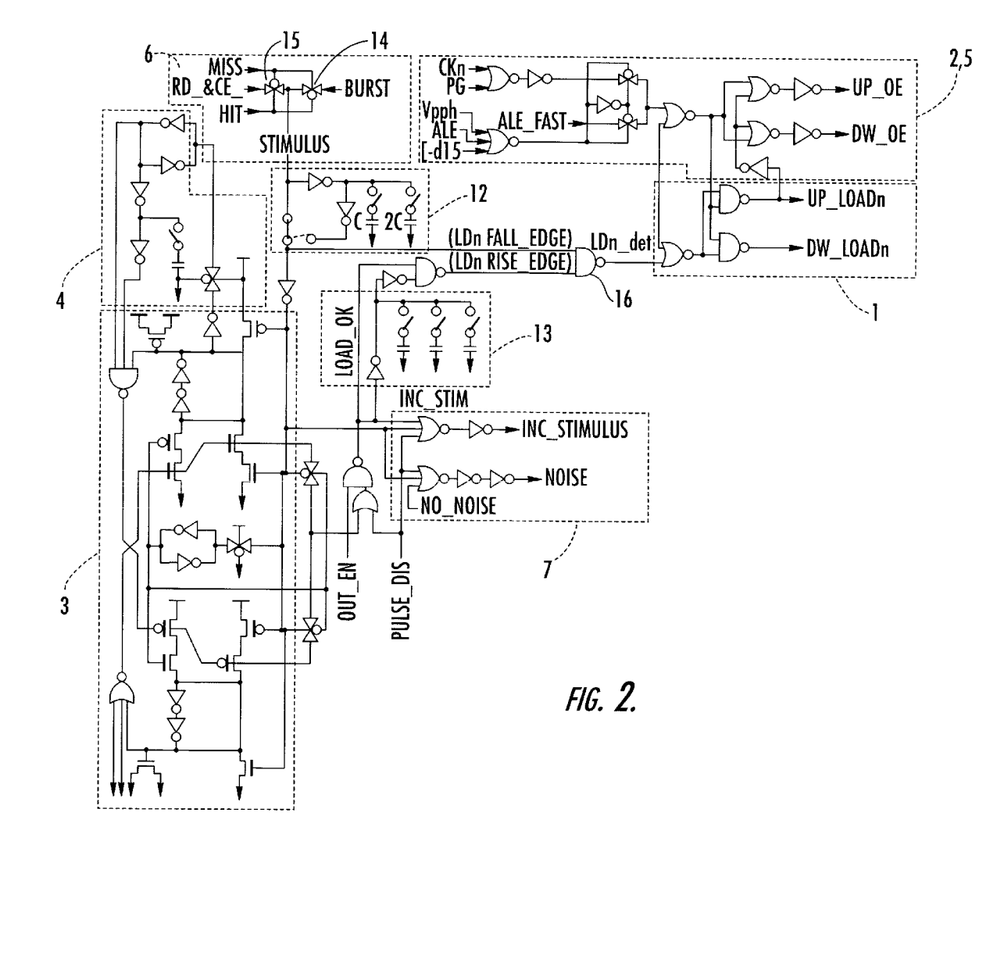
FIG. 2 is a circuit diagram of a possible embodiment of the block diagram of FIG. 1.

The block diagram of FIG. 1 can be provided for example as shown, in greater circuit detail, in FIG. 2, in which identical reference numerals designate identical elements.

In particular, the switching means 6 comprises a pair of pass transistors 14 and 15: the pass transistor 14 receives, at the base terminal of the P transistor that forms it, the signal MISS, while the same signal is sent as an input to the base terminal of the N transistor that forms the pass transistor 15.

Likewise, the signal HIT is sent as an input to the base terminal of the N transistor that forms (together with the P transistor) the pass transistor 14 and to the base terminal of the P transistor that forms (together with the N transistor) the pass transistor 15.

The pass transistors 14 and 15 are further driven by the signal RD&CE (sent to the pass transistor 14) and the signal BURST (sent to the pass transistor 15).

The output signal of the switching means 6 is the signal STIMULUS, which is sent to the means 12 for modulating the duration of said signal.

It should be noted that two output loading signals have been indicated with regard to the means 1, i.e., UP-LOADn and DW-LOADn, and that likewise two output enabling signals UP-OE and DW-OE too have been indicated. Clearly, a single output signal might also be provided. Here, two output signals have been indicated because a particular embodiment of the memory requires this approach.

Figure 3:
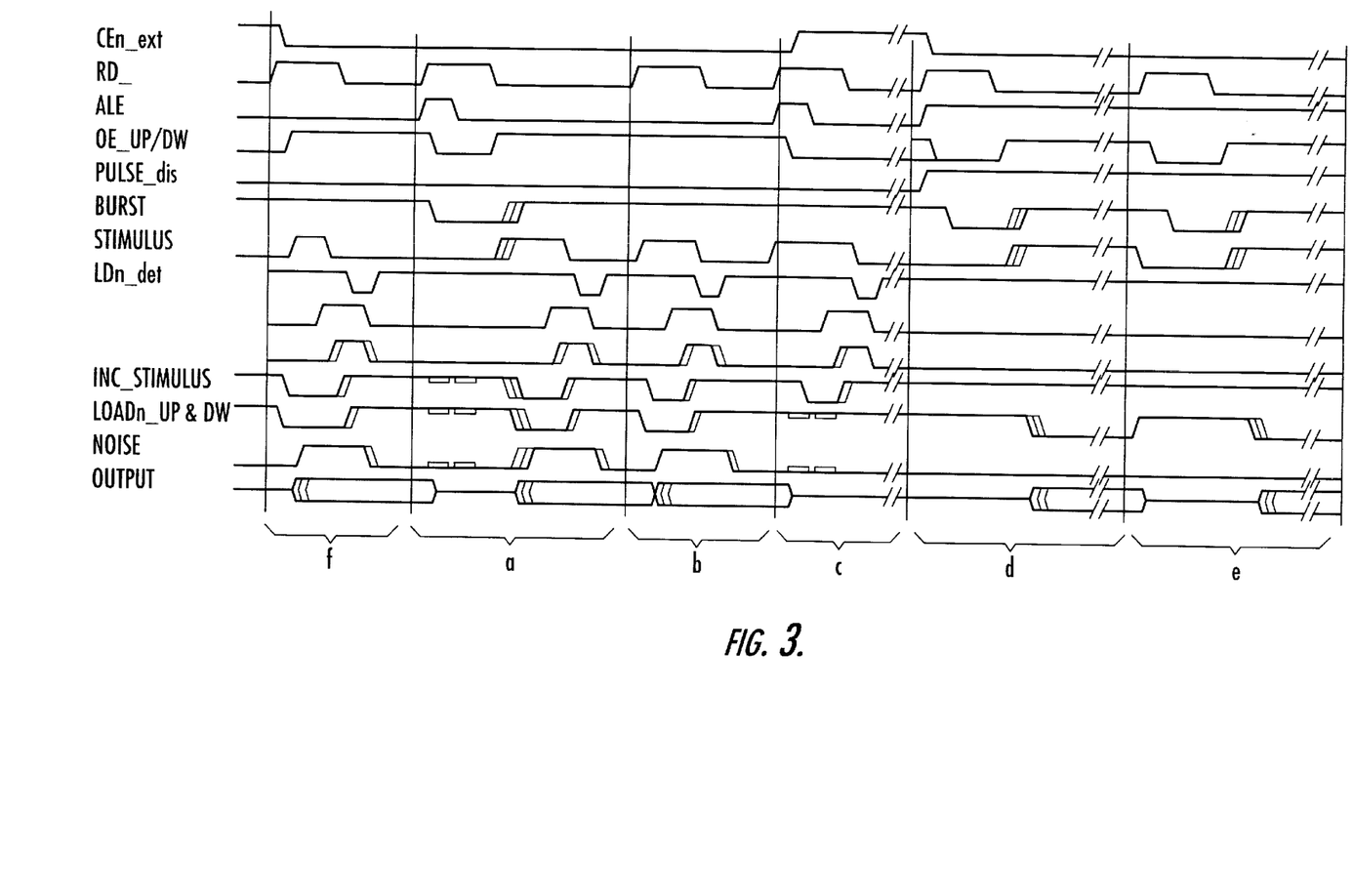
FIG. 3 is a timing chart of the signals involved in the circuit according to the present invention.

The operation of the enabling circuit for output devices according to the present invention is now described with reference to the above-cited FIGS. 1 and 2 and with reference to the timing chart 3.

The reading of an electronic memory always begins with a random-type cycle and the BURST signal is initially brought to zero. This occurs in the initial part of the random cycle, and the switching means 6 are brought to the signal BURST, i.e., the passage of the signal BURST is enabled. At this point, the signal BURST becomes high and causes the generation of the signal STIMULUS, which changes from low to high and is sent as an input to the means 3, 4 for creating (simulating) the delay of the output buffer and the stimulus increment means.

The means 3 and 4, following the reception of the signal STIMULUS, generate the signal which is input into a NAND gate 16, which emits a signal output LDn-det which is then input to the driving means 1 of the output buffer in order to then obtain the output buffer loading signals, which are advantageously divided into UP-LOADn and DW-LDAn. This signal is also sent, across the delay reproducing means 3 and 4, to the increment stimulus means 7 in order to generate, only at the end of LOADn, the signal INC-stimulus and to the means 13 for modulating the duration of the output of the means 3, 4.

Simultaneously with the transition of the signal STIMULUS from low to high, the signal LDn-det becomes low, forcing the signals UP-LOADn and DW-LOADn to the low level, thus allowing updating inside the buffer.

Also the signal INC-stimulus is updated to the low level with the occurrence of the primary signal STIMULUS and remains at the low level (0) until, at the end of the propagation of the means 3 and 4, a clearance signal for loading in the buffer becomes high. This event sets INC-stimulus to the high level (1) and, with a slight delay, forces the end of the pulses DW-LOADn and UP-LOADn. It should be noted that the transition from 0 to 1 of the signal INC-stimulus produces the necessary increment pulse for advancing the activities of the memory, which by design occurs at the end of the pulses UP-LOADn, allowing memory updating only at the end of a complete cycle.

In the same manner, the signal NOISE, which allows ideal synchronization for noise prevention, is stimulated at the onset of the signal STIMULUS and is terminated upon activation of the signal NO-NOISE produced by the system, which coincides with the end of the increment pulse. The signal NOISE is therefore the envelope of the LOADn and increment signals.

It should be noted that the pulsed signals DW-LOADn and UP-LOADn, INC-stimulus and NOISE are produced as a consequence, and only as a consequence, of the transition from 0 to 1 of the signal STIMULUS and are terminated with the transition to the high level of the buffer loading clearance signal, which ends the signals and at the same time prevents any new generation thereof until the signal STIMULUS is brought to the low level (0). In practice, the entire structure has a monostable behavior in which the delay simulation means 3, 4 determine the characteristics of the pulse. This characteristic of the circuit not only allows the set of pulses to be set, but also allows the advancement of the activities of the memory to be a consequence of the external control signals CE, RD and ALE.

By way of the synthesis in a single advancement signal for the memory, STIMULUS, it is in fact possible to apply control of the interleaved protocol conditions. The signal STIMULUS in fact performs a positive transition (from 0 to 1) every time the following are produced:

transition from 1 to 0 of the signal RDn when a random cycle (presence of the signal ALE) is in progress;

a transition from 0 to 1 of the signal RDn when a burst cycle (absence of the signal ALE) is in progress;

a transition from 1 to 0 the signal CEn when a burst cycle with return from standby is in progress. Correct selection of the occurrence of STIMULUS is ensured by the system by way of the management of the selection structure EDGE-SW, which discriminates to discriminate between a synchronous operating mode and an asynchronous one.

Accordingly, a plurality of functional aspects of the system are thus incorporated in a single circuit embodiment:

implementation of a set of pulsed signals;

uniqueness of the stimuli to the active transitions;

verification of compliance with the interleaved protocol;

locking of the pulses to the characteristics of the controlled structures;

functional effectiveness maintained even when entering standby configurations.

The above-listed activities are all triggered by the chip enabling signal CEn-ext, which passes from high to low, by the presence of a read signal RD and by the presence of the address latch enable signal ALE.

The cycle of the memory being considered is the random cycle designated by "a" in FIG. 3. This cycle shows that after the ALE pulse the signals OE-UP/DW pass from high to low, and so does the above-cited BURST signal.

The output signal is generated on the falling front of the signals UP-LOADn and DW-LOADn, i.e., the emission of the data item from the output buffer is enabled and therefore the signal OUTPUT passes from low to high, as shown in the last line of the chart of the state transitions of the signals of the circuit according to the invention, shown in FIG. 3.

The BURST signal again returns from low to high when the signal STIMULUS has already passed from low to high, while the signal STIMULUS again becomes low after the signal LDn-det has switched from low to high.

At this point, the signal STIMULUS is generated again, cycle "b" (sequential reading), with the arrival of the signal RD, which again passes from low to high. In this case, cycle "b", the signal ALE is not present.

The switching means 6 are switched, in this step, to the signal RD&CE, and are driven by the signal HIT.

The subsequent cycle "c", shown in FIG. 3, is characterized by the presence of the signal CEn-ext, which passes from low to high after the transition of the signal ALE from low to high. In this case, the signal STIMULUS is produced again, but the signals UP-LOADn and DW-LOADn are not produced, as shown by the dashed line at the row of the respective above-cited signals in the chart of FIG. 3.

This is due to the fact that the external negated chip enabling signal CEn-ext has passed from low to high, accordingly disabling the loading of the outputs of the buffer.

However, this does not prevent the generation of the signal STIMULUS and of the signal INC-stimulus, thus causing the advancement of the memory even if it is brought to the standby condition.

Cycle "c" is a cycle in which the memory enters standby.

The subsequent cycles "d" and "e" are characterized by the presence of the signal ALE, which remains always high and is no longer pulsed as in the preceding cycles.

In these cycles, the signal STIMULUS is produced exclusively when the signal BURST occurs. The signal BURST is enabled exclusively by the occurrence at low level (0) of RDn. When the signal STIMULUS occurs, only the signals UP-LOADn and DW-LOADn are produced. These signals are not pulsed (they follow the low level of RDn) since the system, by setting Pulse-dis=1, disables the line INC-stimulus and the pulsed nature of the loading signals LOADn.

In practice, the switching means 6 in this step do not switch and remain fixed on the signal BURST, which is closely correlated to the external signal RDn.

In the conventional cycles "e" and "f", the read signal RD, when high, places the outputs of the buffer in the tristate condition, and the output signal OUTPUT is in fact generated only when the signal RD changes from high to low.

The cycle designated by "f" instead indicates what happens when the memory comes from a standby condition.

During return from standby, which is characterized by the absence of the signal ALE, as indicated at the cycle "f", the signal STIMULUS is generated and the signal LDn-det passes from high to low.

During this cycle "f", also the increment signal INC-stimulus is generated and is the increment signal of the counter of the memory.

The duration of the signals LOADn and INC-stimulus produced by the signal INC-stimulus is correlated to the propagation in the circuit network that reproduces the delays of the counter 4 and in the circuit network that reproduces the delays of the output buffer 3.

The same signals LOADn and INC-stimulus can be further modulated with the means for modulating the signal STIMULUS 12, which are optional, and so are the means 13 for modulating the duration of the output of the means 3 and 4.

The modulation means 12 and 13 are therefore used as an additional safety, in order to lock the duration of the signals not only to the duration of the propagations that are reproduced in the circuit according to the invention but also to additional delay networks which allow addition of a user-determined delay.

The circuit according to the invention therefore ensures to ensures a connection between the sense amplifier and the corresponding output buffer in more than one of the operating modes of a memory.

It further allows generation of the synchronization signals that are useful for the synchronization of the timing activities of the memory.

The memory timing activities are stimulated in accordance with the configuration of control signals which are characteristic of the current operating mode of the memory.

The circuit according to the invention further allows to disablement, when required, the external visibility of the data read by the sense amplifier and to generate pulses whose duration is closely correlated to the propagation characteristics of the controlled networks, such as address increment circuits and the like.

In practice it has been observed that the circuit according to the invention fully achieves the intended aim and objects.

The circuit thus conceived is susceptible to numerous modifications and variations, all of which are within the scope of the inventive concept. All the details may furthermore be replaced with other technically equivalent elements.

What is claimed is:

1. An enabling circuit for an output buffer in a memory having separate reading paths, the enabling device comprising:
    output buffer driver means for driving loading of the output buffer;
    output enabling means for enabling said output buffer driver means;
    timing means for controlling the switching of said output enabling means; and
    switching means being responsive to a read mode signal for providing a stimulus signal for loading of the output buffer and for performing a switching between the separate reading paths of the memory, and said switching means comprising increment determining means for generating a signal for incrementing a current read address of the memory at an end of the stimulus signal.

2. An enabling circuit according to claim 1, further comprising:
    increment stimulus means connected to said increment determining means for providing an increment signal; and
    delay generation means connected to said increment stimulus means and to said output buffer driver means for providing a delay signal for causing an output delay, said delay generation means being connected downstream of said timing means.

3. An enabling circuit according to claim 2, further comprising second modulation means connected downstream of said switching means for modulating duration of the delay signal provided by said delay generation means.

4. An enabling circuit according to claim 2, wherein the stimulus signal and the increment signal have a time duration which is correlated to a propagation time of a signal within said output buffer.

5. An enabling circuit according to claim 2, wherein said increment stimulus means provides a noise event synchronization signal to said switching means.

6. An enabling circuit according to claim 5, wherein the stimulus signal, the increment signal and the noise event synchronization signal are concatenated and started by a single signal.

7. An enabling circuit according to claim 6, wherein the stimulus signal, the increment signal and the noise event synchronization signal are started at a positive transition of the single signal.

8. An enabling circuit according to claim 7, wherein the positive transition of the single signal occurs at a positive transition of a read signal and of a chip enable signal which are internal to the memory.

9. An enabling circuit according to claim 7, wherein the positive transition of the single signal occurs at a positive transition of a mode signal which indicates an asynchronous pulsed mode.

10. An enabling circuit according to claim 5, wherein the increment signal and the noise event synchronization signal occur at the end of the stimulus signal.

11. An enabling circuit according to claim 1, further comprising first modulation means connected downstream of said switching means for modulating duration of the stimulus signal.

12. An enabling circuit for an output buffer in a memory having separate reading paths, the enabling device comprising:
    an output buffer driver for driving loading of the output buffer;
    an output enabling circuit for enabling the output buffer driver;
    a timing circuit for controlling the switching of said output enabling circuit; and
    a switching circuit being responsive to a read mode signal for providing a stimulus signal for loading of the output buffer and for performing a switching between the separate reading paths of the memory, and said switching circuit comprising
    an increment determining circuit for generating a signal for incrementing a current read address of the memory at an end of the stimulus signal.

13. An enabling circuit according to claim 12, further comprising:
    an increment stimulus circuit connected to said increment determining circuit for providing an increment signal; and
    a delay generation circuit connected to said increment stimulus circuit and to said output buffer driver for providing a delay signal for generating an output delay, said delay generation circuit being connected downstream of said timing circuit.

14. An enabling circuit according to claim 12, further comprising a first modulation circuit connected downstream of said switching circuit for modulating duration of the stimulus signal.

15. An enabling circuit according to claim 13, further comprising a second modulation circuit connected downstream of said switching circuit for modulating duration of the delay signal provided by said delay generation circuit.

16. An enabling circuit according to claim 13, wherein the stimulus signal and the increment signal have a time duration which is correlated to a propagation time of a signal within said output buffer.

17. An enabling circuit according to claim 13, wherein said increment stimulus circuit provides a noise event synchronization signal to said switching circuit.

18. An enabling circuit according to claim 17, wherein the stimulus signal, the increment signal and the noise event synchronization signal are concatenated and started by a single signal.

19. An enabling circuit according to claim 18, wherein the stimulus signal, the increment signal and the noise event synchronization signal are started at a positive transition of the single signal.

20. An enabling circuit according to claim 19, wherein the positive transition of the single signal occurs at a positive transition of a read signal and of a chip enable signal which are internal to the memory.

21. An enabling circuit according to claim 19, wherein the positive transition of the single signal occurs at a positive transition of a mode signal which indicates an asynchronous pulsed mode.

22. An enabling circuit according to claim 17, wherein the increment signal and the noise event synchronization signal occur at the end of the stimulus signal.

23. A memory having separate reading paths, the memory comprising:
   an output buffer; and
   an enabling circuit connected to said output buffer and comprising
      an output buffer driver for driving loading of said output buffer,
      an output enabling circuit for enabling said output buffer driver,
      a timing circuit for controlling the switching of said output enabling circuit, and
      a switching circuit being responsive to a read mode signal for providing a stimulus signal for loading of said output buffer and for performing a switching between the separate reading paths of the memory, and said switching circuit comprising an increment determining circuit for generating a signal for incrementing a current read address of the memory at an end of the stimulus signal.

24. A memory according to claim 23, further comprising:
   an increment stimulus circuit connected to said increment determining circuit for providing an increment signal; and
   a delay generation circuit connected to said increment stimulus circuit and to said output buffer driver for providing a delay signal for generating an output delay, said delay generation circuit being connected downstream of said timing circuit.

25. A memory according to claim 24, further comprising a second modulation circuit connected downstream of said switching circuit for modulating duration of the delay signal provided by said delay generation circuit.

26. A memory according to claim 24, wherein the stimulus signal and the increment signal have a time duration which is correlated to a propagation time of a signal within said output buffer.

27. A memory according to claim 24, wherein said increment stimulus circuit provides a noise event synchronization signal to said switching circuit.

28. A memory according to claim 27, wherein the stimulus signal, the increment signal and the noise event synchronization signal are concatenated and started by a single signal.

29. A memory according to claim 28, wherein the stimulus signal, the increment signal and the noise event synchronization signal are started at a positive transition of the single signal.

30. A memory according to claim 29, wherein the positive transition of the single signal occurs at a positive transition of a read signal and of a chip enable signal which are internal to the memory.

31. A memory according to claim 29, wherein the positive transition of the single signal occurs at a positive transition of a mode signal which indicates an asynchronous pulsed mode.

32. A memory according to claim 27, wherein the increment signal and the noise event synchronization signal occur at the end of the stimulus signal.

33. A memory according to claim 23, further comprising a first modulation circuit connected downstream of said switching circuit for modulating duration of the stimulus signal.

34. A method for enabling an output buffer in a memory having separate reading paths, the method comprising:
   loading the output buffer using an output buffer driver;
   enabling the output buffer driver using an output enabling circuit;
   controlling the switching of the output enabling circuit; and
   providing a stimulus signal for loading of the output buffer and for performing a switching between the separate reading paths of the memory using a switching circuit responsive to a read mode signal, the switching circuit comprising an increment determining circuit for generating a signal for incrementing a current read address of the memory at an end of the stimulus signal.

35. A method according to claim 34, further comprising:
   an increment stimulus circuit connected to the increment determining circuit for providing an increment signal; and
   a delay generation circuit connected to the increment stimulus circuit and to the output buffer driver for providing a delay signal for generating an output delay.

36. A method according to claim 35, further comprising modulating duration of the delay signal provided by the delay generation circuit using a second modulation circuit connected downstream of the switching circuit.

37. A method according to claim 35, wherein the stimulus signal and the increment signal have a time duration which is correlated to a propagation time of a signal within the output buffer.

38. A method according to claim 35, wherein the increment stimulus circuit provides a noise event synchronization signal to the switching circuit.

39. A method according to claim 38, wherein the stimulus signal, the increment signal and the noise event synchronization signal are concatenated and started by a single signal.

40. A method according to claim 39, wherein the stimulus signal, the increment signal and the noise event synchronization signal are started at a positive transition of the single signal.

41. A method according to claim 40, wherein the positive transition of the single signal occurs at a positive transition of a read signal and of a chip enable signal which are internal to the memory.

42. A method according to claim 40, wherein the positive transition of the single signal occurs at a positive transition of a mode signal which indicates an asynchronous pulsed mode.

43. A method according to claim 38, wherein the increment signal and the noise event synchronization signal occur at the end of the stimulus signal.

44. A method according to claim 34, further comprising modulating duration of the stimulus signal using a first modulation circuit connected downstream of the switching circuit.

45. An enabling circuit for an output buffer in a memory having separate reading paths, the enabling device comprising:
   output buffer driver for driving loading of the output buffer;
   an output enabling circuit for enabling said output buffer driver;
   a timing circuit for controlling the switching of said output enabling circuit;

a switching circuit being responsive to a read mode signal for providing a stimulus signal for loading of the output buffer and for performing a switching between the separate reading paths of the memory; and a first modulation circuit connected downstream of said switching circuit for modulating duration of the stimulus signal.

46. An enabling circuit according to claim 45, wherein said switching circuit comprises an increment determining circuit for generating a signal for incrementing a current read address of the memory at an end of the stimulus signal.

47. An enabling circuit according to claim 46, further comprising:

an increment stimulus circuit connected to said increment determining circuit for providing an increment signal; and a delay generation circuit connected to said increment stimulus circuit and to said output buffer driver for providing a delay signal for causing an output delay, said delay generation circuit being connected downstream of said timing circuit.

48. An enabling circuit according to claim 47, further comprising a second modulation circuit connected downstream of said switching circuit for modulating duration of the delay signal provided by said delay generation circuit.

49. An enabling circuit according to claim 47, wherein the stimulus signal and the increment signal have a time duration which is correlated to a propagation time of a signal within said output buffer.

50. An enabling circuit according to claim 47, wherein said increment stimulus circuit provides a noise event synchronization signal to said switching circuit.

51. An enabling circuit according to claim 50, wherein the stimulus signal, the increment signal and the noise event synchronization signal are concatenated and started by a single signal.

52. An enabling circuit according to claim 51, wherein the stimulus signal, the increment signal and the noise event synchronization signal are started at a positive transition of the single signal.

53. An enabling circuit according to claim 52, wherein the positive transition of the single signal occurs at a positive transition of a read signal and of a chip enable signal which are internal to the memory.

54. An enabling circuit according to claim 52, wherein the positive transition of the single signal occurs at a positive transition of a mode signal which indicates an asynchronous pulsed mode.

55. An enabling circuit according to claim 50, wherein the increment signal and the noise event synchronization signal occur at the end of the stimulus signal.

* * * * *

UNITED STATES PATENT AND TRADEMARK OFFICE
CERTIFICATE OF CORRECTION

PATENT NO.     : 6,438,040 B1                                                     Page 1 of 1
DATED          : August 20, 2002
INVENTOR(S)    : Luigi Pascucci It is certified that error appears in the above-identified patent and that said Letters Patent is hereby corrected as shown below:

Column 2,
Line 28, delete "verified lo condition" insert -- verified condition --
Line 60, delete "of nonlimiting" insert -- of a nonlimiting --

Column 4,
Line 52, delete "DW-LDAn" insert -- DW-LOADn --
Line 52, delete "sent, across" insert -- sent across --

Column 5,
Line 31, delete "transition" insert -- a transition --
Line 35, delete "0 the signal" insert -- 0 of the signal --
Lines 39-40, delete "to discriminate"

Column 6,
Line 66, delete "allow" insert -- allows --

Column 7,
Lines 1-2, delete "to ensures"
Line 11, delete "allows to" insert -- allows --

Signed and Sealed this

Eleventh Day of February, 2003

JAMES E. ROGAN
*Director of the United States Patent and Trademark Office*